United States Patent [19]

Marine et al.

[11] 3,959,026

[45] May 25, 1976

[54] METHOD OF PREPARATION OF A SEMICONDUCTING TERNARY ALLOY FROM THE SEMICONDUCTING COMPOUND ZNTE BY ION

[75] Inventors: Jean Marine, Grenoble; Huguette Rodot, Meudon-Bellevue, both of France

[73] Assignees: Commissariat a l'Energie Atomique, Grenoble; Agence Nationale de Valorisation de la Recherche (ANVAR), Meudon-Bellevue, both of France

[22] Filed: Sept. 11, 1974

[21] Appl. No.: 504,955

[30] Foreign Application Priority Data
Sept. 11, 1973  France .............................. 73.32643

[52] U.S. Cl. ................................ 148/1.5; 148/187; 357/91; 427/66
[51] Int. Cl.² ........................................ H01L 21/265
[58] Field of Search ............ 148/105, 187; 117/201; 252/62.3 ZT; 357/91

[56] References Cited
UNITED STATES PATENTS

| | | | |
|---|---|---|---|
| 3,658,582 | 4/1972 | Coker et al. | 117/201 |
| 3,732,471 | 5/1973 | Hou et al. | 148/1.5 X |

OTHER PUBLICATIONS
Parker et al., "Preparation and Properties of MgZnTe", J. Electrochem. Soc., Vol. 118, No. 6, June 1971, pp. 979–983.

*Primary Examiner*—L. Dewayne Rutledge
*Assistant Examiner*—Davis: J. M.
*Attorney, Agent, or Firm*—Lane, Aitken, Dunner & Ziems

[57] ABSTRACT

A wafer of the semiconducting compound ZnTe is subjected to at least one bombardment by a magnesium ion flux, the energy and density of the bombardment or bombardments being such as to obtain a desired concentration of magnesium ions in the portion of the semiconductor to be doped and this is followed by a thermal annealing operation, the concentration of magnesium being such as to obtain an alloy having the formula $Mg_xZn_{1-x}Te$ with $0<X<1$.

13 Claims, 6 Drawing Figures

METHOD OF PREPARATION OF A SEMICONDUCTING TERNARY ALLOY FROM THE SEMICONDUCTING COMPOUND ZNTE BY ION

This invention relates to a method of preparation of the ternary semiconducting alloy having the formula $Mg_xZn_{1-x}Te$. In more precise terms, the present invention relates to a method of preparation of the above-defined alloy from the semiconducting compound ZnTe by ion implantation.

Up to the present time, ion implantation has been mainly employed as a technique for doping semiconductors, that is to say for producing concentrations of doping ions of the order of $10^{18}$ to $10^{21}$ atoms/cm$^3$. This technique has been employed chiefly for the construction of electronic devices in either silicon or germanium (diodes, bipolar transistors, MOS transistors and the like). By means of this technique, however, a number of successful attempts have been made to dope binary semiconductors (ZnTe, CdS, CdTe) in which the formation of p-n junctions was made impossible by the other methods of doping (diffusion, alloying, epitaxial growth).

Although not well known, the alloys of the form $Mg_xZn_{1-x}Te$ have already been described in the literature. Crystals of this type have been fabricated by conventional metallurgical methods either at the Bellevue Laboratories of the French National Center for Scientific Research (C.N.R.S.) or by Parker (Journal of the Electro-Chemical Society, June, 1971). In the case last mentioned, the $Mg_xZn_{1-x}Te$ alloy is obtained by heating the mixture ZnTe, Mg and Te which is melted in a graphite-lined quartz tube at a temperature of the order of 1200°C. This very difficult preparation does not make it possible, however, to obtain good single crystals.

This invention is precisely directed to a method of preparation of a ternary structure having the formula $Mg_xZn_{1-x}Te$ with $0<X<1$ starting with a binary semiconductor having the formula ZnTe which essentially consists in subjecting a wafer of said binary secondconductor to at least one bombardment with a flux of magnesium ions, the energy and the density of the ion flux or fluxes being such as to obtain a desired uniform concentration for example of magnesium ions in the portion of said semiconductor to be doped and in carrying out a thermal annealing operation, the concentration of magnesium being such as to obtain an alloy having the formula $Mg_xZn_{1-x}Te$.

In accordance with another characteristic feature, the ion bombardments are performed through a metal layer and said metal layer is then removed by chemical attack.

In accordance with an alternative mode of operation which is carried out after completion of the thermal annealing process, the surface layer of said semiconductor thus obtained is removed by chemical attack.

In other words, there is employed at the outset a semiconductor of zinc telluride (ZnTe) and magnesium ions are implanted in order to form, to a predetermined depth in the starting crystal, a $Mg_xZn_{1-x}Te$ alloy in which X can assume any value between 0 and 1. The advantage of this method is immediately apparent since the composition of a semiconductor crystal employed as starting material is modified by this method and accordingly results in a novel material having novel properties. The advantage of producing the substance $Mg_xZn_{1-x}Te$ from zinc telluride crystals is especially apparent in the field of electroluminescent devices in which it is desirable to obtain blue emitters in addition to the emitters ranging from red to green which are already known.

The present invention is also concerned with the ternary alloy $Mg_xZn_{1-x}Te$ as obtained by the method hereinabove defined.

A clearer understanding of the invention will be gained from the following description of a number of embodiments of the method according to the invention, reference being made to the accompanying figures in which.

When a crystal is bombarded with ions of energy E, the depth distribution of these ions is achieved in accordance with a concentration curve of Gaussian shape. The depth (z) of the maximum of the Gaussian curve, its standard divergence and its amplitude are on the one hand a function of the incident ion and of the bombarded crystal and on the other hand of the energy E and of the total ion dose received by the crystal. It is possible by means of a computer program to calculate the depth distribution of any implanted atom in different substrates in respect of different implantation energies.

Figure 1:
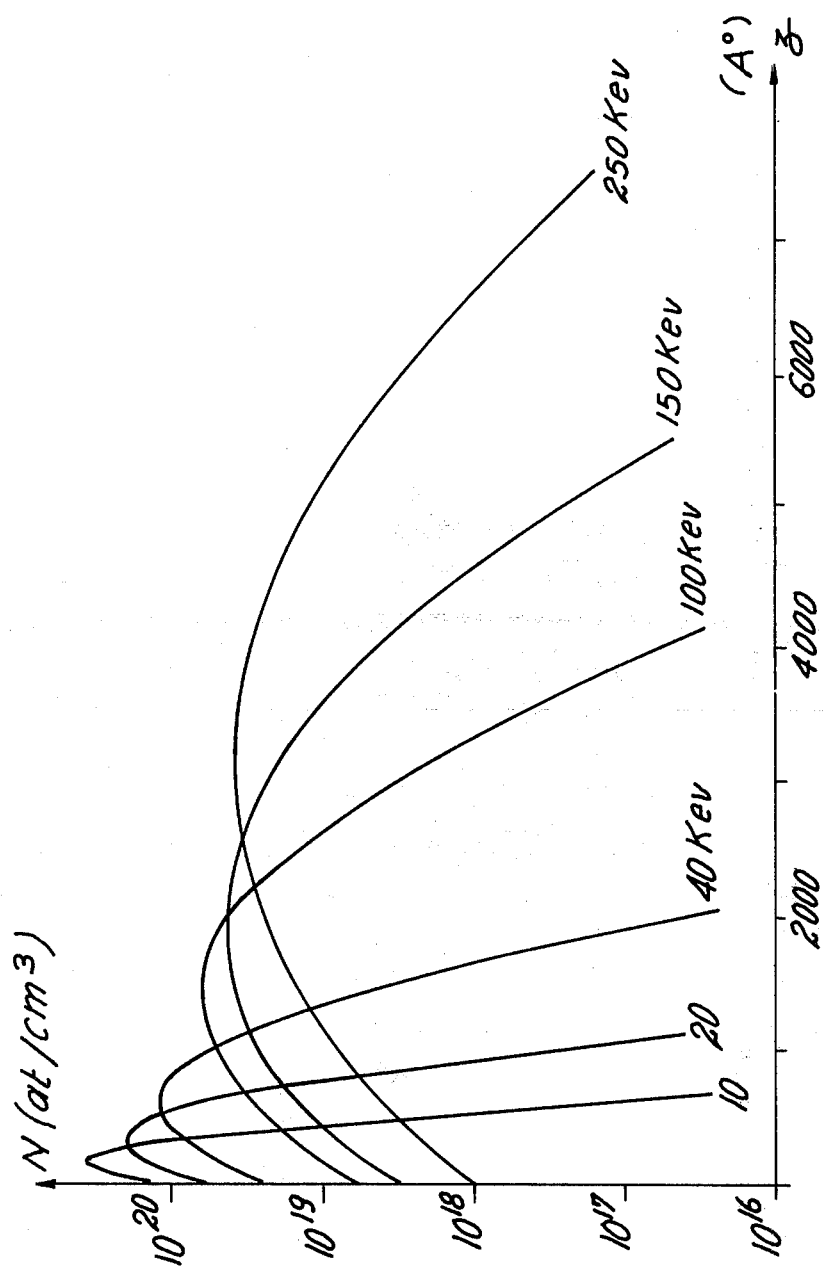
FIG. 1 shows curves which represent the n-type doping in atoms per cm$^3$ as a function of the depth of penetration in the zinc telluride in respect of an implanted dose of $10^{15}$ atoms per cm$^2$ of magnesium and in respect of acceleration energies of 10 to 250 KeV.

FIG. 1 shows one example of computation for the penetration of magnesium ions in non-oriented zinc telluride (without regard for channelling effect). Each curve represents the n-type doping in atoms/cm$^3$ as a function of the depth of penetration z from the penetration face in respect of a flux of $10^{15}$ at/cm$^3$ of magnesium ions and in respect of different energies. Each curve corresponds respectively to energies of: 10, 20, 40, 100, 150 and 250 KeV. This series of curves of Gaussian shape clearly makes it possible to establish implantation conditions (dose and energy) which produce a distribution profile in accordance with the requirements of the implanted atoms. In the case under consideration, particular attention is given to the achievement of a constant distribution profile to a predetermined depth by means of a series of implantations at a given energy and a given dose. This has been achieved in FIG. 2 in the case of magnesium in zinc telluride.

Figure 2:
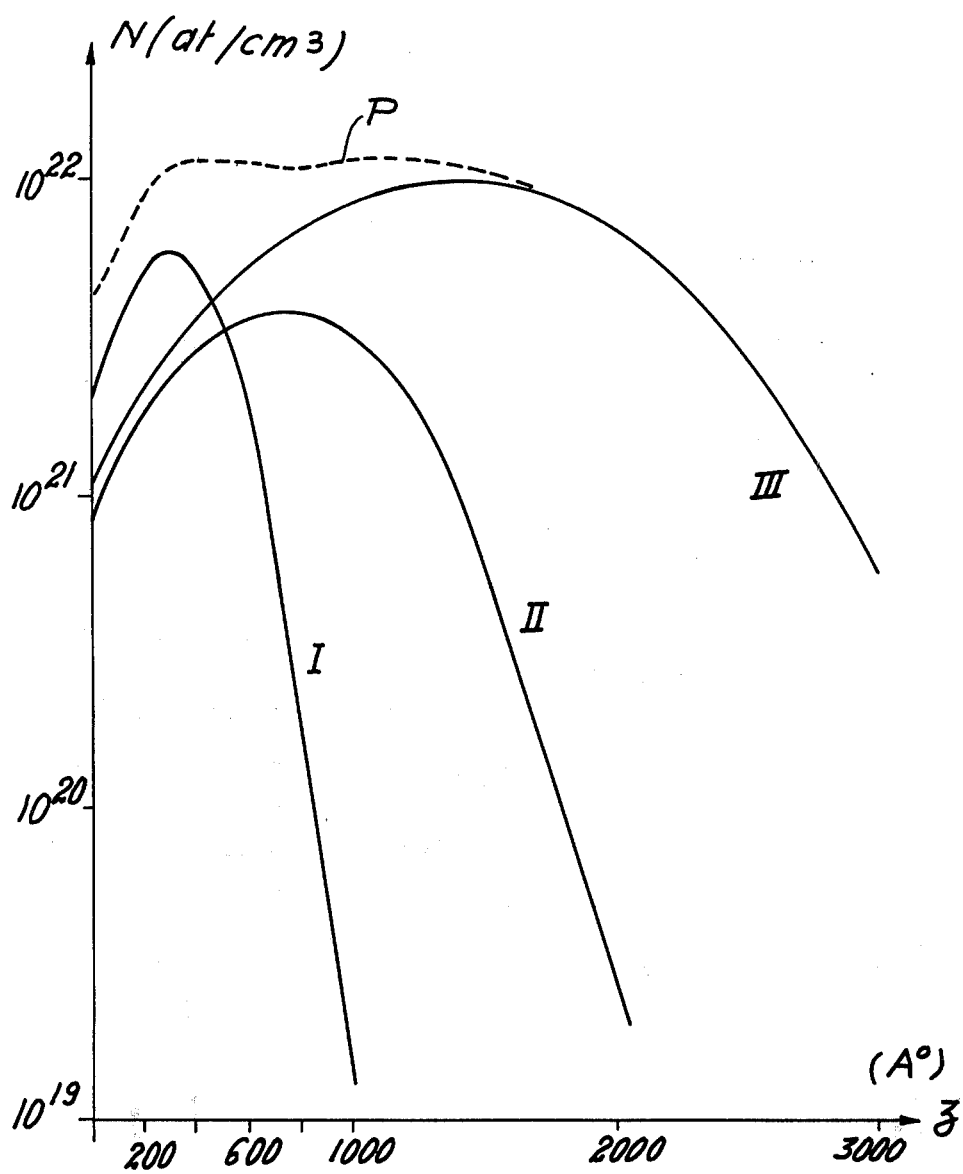
FIG. 2 shows an example of combination of these curves with a view to obtaining a uniform concentration of the implanted magnesium.
Figure 3:
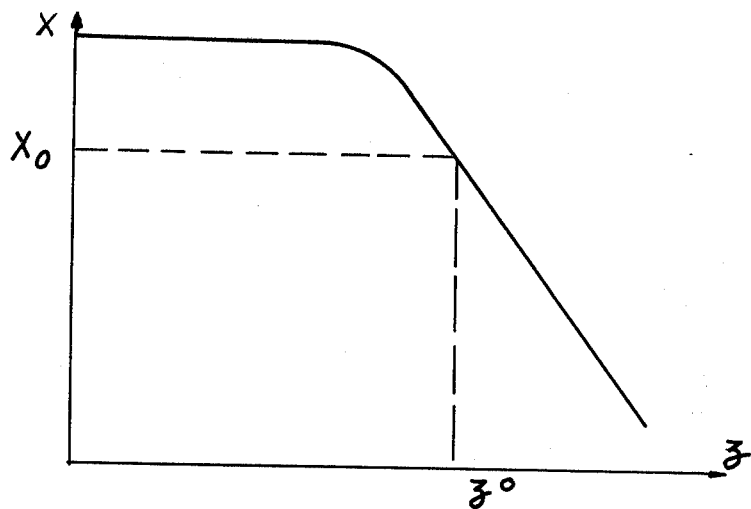
FIG. 3 shows the curve which represents the concentration of magnesium as a function of the depth in the crystal.

Near the surface of the sample (as shown in FIG. 2), there is a thickness of 200 to 300 A such that the quantity of magnesium which is present is smaller than that of the plateau P. In order to eliminate this thickness of 200 to 300 A in which the quantity of magnesium is too small, two methods may be employed:

a. — This film-layer can be removed by controlled chemical attack so that the surface of the sample should have a maximum concentration of magnesium;

b. — It is possible to deposit on the surface of the zinc telluride substrate a metallic film having a thickness of 200 to 300 A and to carry out the ion implantation through said metallic film which is subsequently removed by chemical attack. The distribution profile of the implanted atoms as shown in FIG. 3 is obtained after implantation and chemical attack.

The crystal is heated during the ion bombardment and zinc vacanies are created. This is due to an intrinsic property of zinc telluride, the zinc concentration of which decreases when heated in vacuo. Moreover, during the implantation, the atoms of the lattice are displaced as a result of the impacts between the incident ion and the atoms of the substrate. Displaced zinc sites therefore exist in the bombarded crystal and the magnesium ion can accordingly occupy said sites.

In order to eliminate modifications arising from the ion implantation, a thermal annealing treatment is carried out after said implantation at a temperature of the order of 550°C.

Zinc telluride is a p-type semiconductor in which the value of the width of forbidden band $E_g$ is 2.26 eV at 300°K. In the case of MgTe, the value of the width of forbidden band aforesaid at 300°K is of the order of 3.4 eV and is of the n-type.

Figure 4:
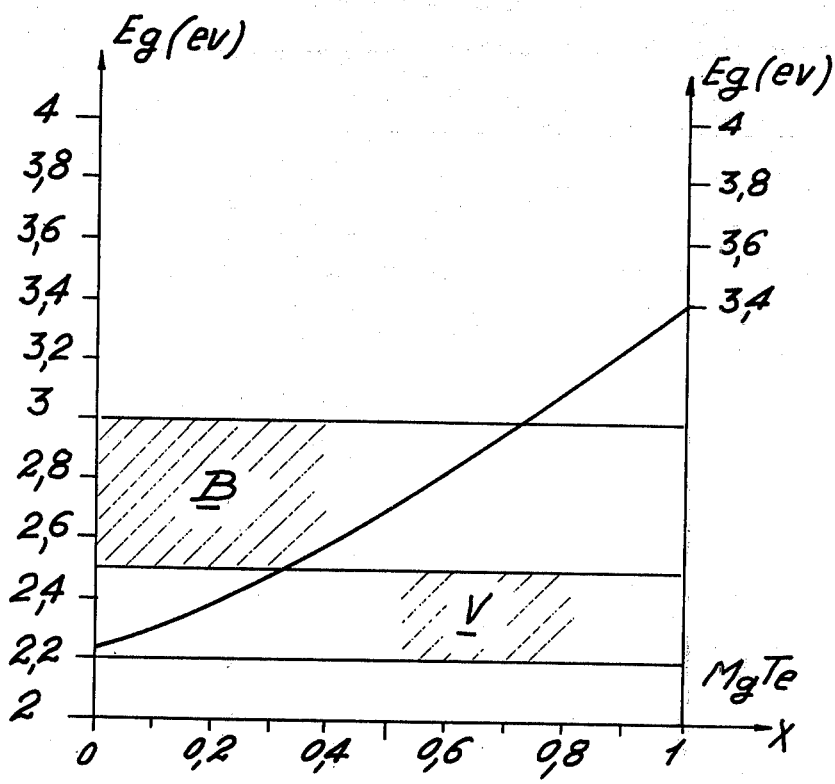
FIG. 4 shows the curve which gives the width of the forbidden band (Eg) as a function of the concentration of Mg.

FIG. 4 shows the variations in the width of forbidden band as a function of X. It is observed that a substantially parabolic variation is obtained.

The formation of the luminescent alloy $Mg_xZn_{1-x}Te$ in the blue region will now be described by way of example. Magnesium ions are implanted in a zinc telluride crystal under the following conditions:

|  |  | Energy | Dose |
|---|---|---|---|
| I - | 1st implantation - | 100 KeV | $1.75 \cdot 10^{17}$ at/cm³ |
| II - | 2nd implantation - | 50 KeV | $4.12 \cdot 10^{16}$ at/cm³ |
| III - | 3rd implantation - | 20 KeV | $2.88 \cdot 10^{16}$ at/cm³ |

These conditions of implantation result in a profile of the type shown in FIG. 2. The concentration of magnesium on the plateau P (between 300 and 1600 A) is $10^{22}$ at/cm². This results in a value of X equal to 0.58 in this region. Referring to FIG. 4, this value of X provides the $Mg_{0.58}Zn_{0.42}Te$ alloy with a forbidden band $E_g$ of 2.8 eV.

When a beam of accelerated electrons or of photons having an energy which is higher than 2.8 eV impinges on said alloy, there results a modification in the equilibrium of the charge carriers; a return to equilibrium is achieved through recombination centers and the forbidden band of the alloy thus obtained is 2.8 eV, with the result that emissions in the blue region are thus possible and a blue cathodoluminescent emitter has been obtained.

Figure 5:
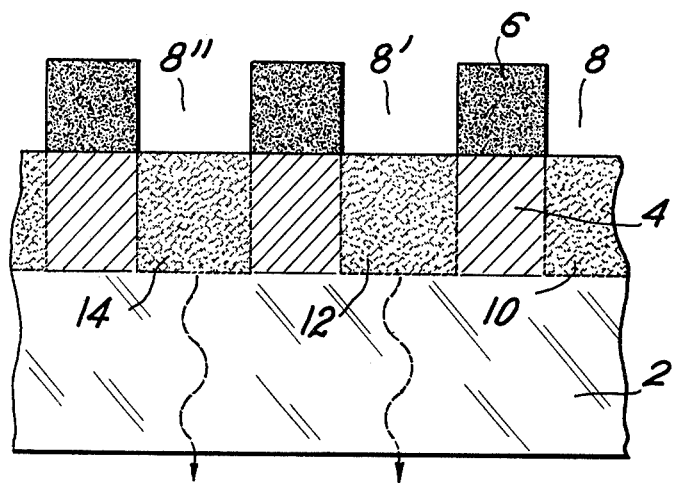
FIG. 5 shows one example of fabrication of a three-color cathodoluminescent emitter.

The construction of three-color cathodoluminescent emitters on a single substrate will now be described, this construction being illustrated in FIG. 5.

There is employed at the outset a transparent substrate 2 on which a layer 4 of zinc telluride is deposited by known means. There is deposited on the zinc telluride layer 4 a mask 6 in which are formed three windows 8, 8', 8''. In order to obtain the zone 10 which emits in the red region, localized doping with oxygen is carried out through the window 8. In order to obtain the zone 12 which emits in the green region, an implantation of phosphorus or of lithium is carried out through the window 8'. In order to obtain the zone 14 which emits in the blue region, an ion implantation of magnesium is carried out by the method hereinabove described.

A beam of accelerated and scanned electrons such as, for example, in a television tube, impinges on each point of the matrix of ZnTe with a predetermined intensity. Each zone 10, 12 and 14 then emits a red, green and blue light respectively. The intensity of the emitted light is a function of the excitation intensity. Proportioning of the mixture of the three basic colors makes it possible to obtain a color image of the electric signal which controls the electron beam.

It is also possible to construct green or blue electroluminescent diodes by means of the method in accordance with the invention. The process which has been described in the foregoing makes it possible to form in a single implantation operation a p-n heterojunction which is capable of emitting either in the green region or in the blue region. It has in fact been shown that above a certain composition, that is to say above a certain value of $X_o$, the undoped ternary alloy is the n-type. The ZnTe substrate is the p-type as well as the ternary alloy if X is smaller than the threshold value $X_o$ as defined in the foregoing. If a magnesium dose is implanted so that X is larger than the threshold value $X_o$, the p-n junction is formed at a depth Zo at which $X = X_o$. The semiconductor is the n-type on the left-hand side of Zo (as shown in FIG. 3) and is the p-type on the right-hand side.

When this diode is forward-biased, there is an injection of electrons in the p portion and an injection of holes in the n portion. Recombination takes place within the zone around the depth zo in which it is possible to have emissions in the blue region. The addition of a donor or of an acceptor displaces either in one direction or in the other the position of the junction with respect to the depth zo at which the composition corresponds to $X_o$. In accordance with a conventional mechanism, this doping makes it possible to substitute for the band-to-band emission an impurity level band-emission of lower energy. The combination of these two phenomena governs the energy of the emitted light.

As can readily be understood, it is possible to produce action on the efficiency of the emitter by making a judicious choice of the level of doping of the zinc telluride and of the implanted layer which is rich in magnesium.

Figure 6:
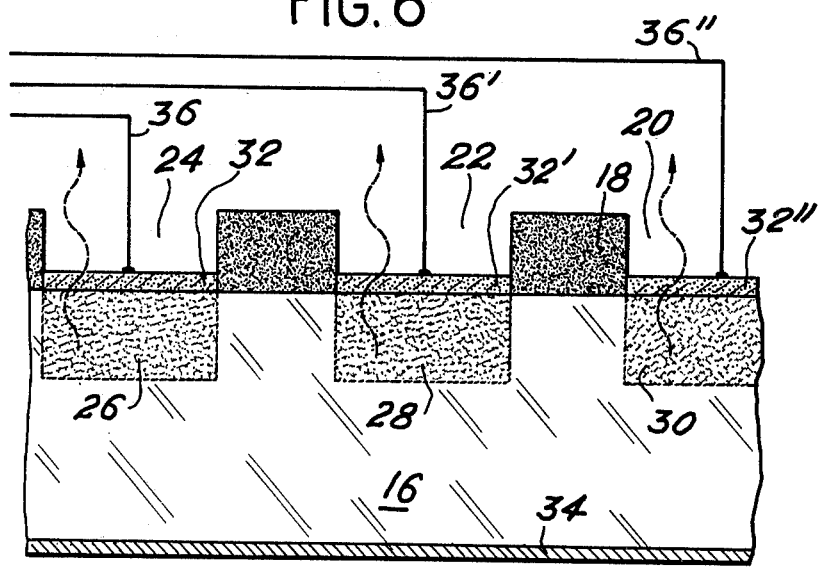
FIG. 6 shows one example of fabricaton of three-color electroluminescent diodes.

There is shown in FIG. 6 one example of construction of a matrix of three-color electroluminescent diodes.

The blue diodes obtained in accordance with the method described in the foregoing can be associated with red and green diodes formed on a single substrate of undoped zinc telluride so as to form a matrix of three-color diodes. The starting material consists of a p-type zinc telluride crystal on which is deposited a mask 18, three windows 20, 22 and 24 being formed in said mask. Deep doping with phosphorus or with lithium is carried out through the window 22 so as to produce a green luminescence. Deep doping with oxygen is performed through the window 24 in order to produce a red luminescence.

Doping of lesser depth with boron or aluminum is carried out through the same windows in order to form the n-p junction which ensures the injection of carriers. This results respectively in a diode 26 which emits in the red region and a diode 28 which emits in the green region. An implantation of Mg is performed through the window 20 so as to obtain a n-type semiconductor within this zone 30.

After an adequate annealing operation as defined earlier so as to place the atoms already implanted in an electrically active site and to eliminate defects created by the implantation, a transparent metallic thin film 32, 32', 32'' is evaporated onto each of the diodes so as to ensure on the one hand electrical contact on the n portion of the junction and on the other hand transparency to the radiations emitted by the diodes. A metallic deposit 34 is formed on the p-type face of the zinc telluride crystal 16. By means of a system of interconnections (36, 36', 36''), it is possible to gain access to each diode and to energize said diode individually, which in turn makes it possible to produce a color image simply by modulating the control signals of each diode.

What we claim is:

1. A method of preparation of a semiconducting ternary structure starting with a binary semiconductor having the formula ZnTe, wherein said method comprises: subjecting a wafer of said semiconductor to at least one bombardment with a flux of magnesium ions, the energy and the density of the bombardment or bombardments being such that a desired concentration of magnesium ions is obtained in the portion of said semiconductor to be droped by displacement of Zn Ions and then thermally annealing the doped semiconductor, the concentration of magnesium being such as to obtain an alloy having the formula $Mg_xZn_{1-x}Te$ with $O<X<1$.

2. A method according to claim 1, wherein said concentration of magnesium ions is uniform.

3. A method according to claim 2, wherein the ion bombardments are performed through a metal layer and said metal layer is then removed by selective chemical attack.

4. A method according to claim 1, wherein the surface layer of the semiconductor is removed by chemical attack after completion of the thermal annealing operation.

5. The method of claim 1 additionally comprising forming a cathodoluminescent emitter in the blue region by depositing a uniform layer of zinc telluride on a transparent substrate and implanting magnesium ions in said layer by ion bombardment with an energy and a density of magnesium ions such that the compound obtained has a forbidden band width of the order of 2.5 eV.

6. The method of claim 1 additionally comprising forming a three-color cathodoluminescent emitter by depositing a uniform layer of zinc telluride on a transparent substrate and then depositing a mask with three windows; doping the zinc telluride with oxygen through the first window and with phosphorus or with lithium through the second window and with magnesium through the third window, with an energy and a density of magnesium ions such that the compound obtained has a forbidden band of the order of 2.8 eV.

7. The method according to claim 1 additionally comprising forming an electroluminescent diode in the blue region, wherein the starting material consists of a p-type zinc telluride wafer, by implanting magnesium ions by magnesium ion bombardment with a flux of sufficient density to ensure that a portion of the $Mg_xZn_{1-x}Te$ is of the n-type, and depositing a transparent metal contact on the doped zone and an ohmic contact on the opposite face of the wafer.

8. A ternary alloy obtained by the method of claim 1.

9. A cathodoluminescent emitter obtained by the method of claim 5.

10. An electroluminescent diode obtained by means of the method according to claim 7.

11. A cathodoluminescent emitter obtained by the method of claim 6.

12. The method of claim 6 additionally comprising depositing a transparent metal contact on each of the doped zones and an ohmic contact on the oppposite face of the wafer.

13. The three-color matrix of electroluminescent diodes obtained by the method of claim 12.

* * * * *

UNITED STATES PATENT OFFICE
CERTIFICATE OF CORRECTION

Patent No. 3,959,026  Dated May 25, 1976

Inventor(s) Jean Marine, et al

It is certified that error appears in the above-identified patent and that said Letters Patent are hereby corrected as shown below:

In the Title, after "ION" insert --IMPLANTATION --.

In the Specification,

Column 1, in the title, after "ION" insert --IMPLANTATION --.

Column 5, line 31, "droped" should read -- doped --.

Signed and Sealed this

Twenty-eighth Day of September 1976

[SEAL]

Attest:

RUTH C. MASON
Attesting Officer

C. MARSHALL DANN
Commissioner of Patents and Trademarks